United States Patent [19]

Kataoka et al.

[11] 4,182,964
[45] Jan. 8, 1980

[54] NEGATIVE RESISTANCE ELEMENT CIRCUIT COMBINATIONS

[75] Inventors: Shoei Kataoka; Hiroshi Tateno, both of Tanashi; Hiroyuki Fujisada, Tachikawa; Hideo Yamada, Tokyo; Mitsuo Kawashima, Tokorozawa; Yasuo Komamiya, Yokohama, all of Japan

[73] Assignee: Kogyo Gijutsuin, Japan

[21] Appl. No.: 273,363

[22] Filed: Jul. 20, 1972

Related U.S. Application Data

[60] Division of Ser. No. 167,410, Jul. 28, 1971, Pat. No. 3,691,481, which is a continuation-in-part of Ser. No. 776,292, Aug. 20, 1968, abandoned.

[30] Foreign Application Priority Data

| Aug. 22, 1967 | [JP] | Japan | 42/53488 |
| Nov. 27, 1967 | [JP] | Japan | 42/75628 |
| Nov. 27, 1967 | [JP] | Japan | 42/75629 |
| Nov. 27, 1967 | [JP] | Japan | 42/75630 |
| Nov. 27, 1967 | [JP] | Japan | 42/75631 |
| Mar. 8, 1968 | [JP] | Japan | 43/14765 |

[51] Int. Cl.² .......................... H03B 7/14; H03F 3/10
[52] U.S. Cl. .................................. 307/299; 331/107 G
[58] Field of Search ................ 330/5; 331/107 G; 307/299

[56] References Cited

U.S. PATENT DOCUMENTS

| 3,526,844 | 9/1970 | Bartelink et al. | 330/5 |
| 3,544,914 | 12/1970 | Suga | 330/5 |
| 3,551,831 | 12/1970 | Kino et al. | 330/5 |

*Primary Examiner*—K. V. Rolinec
*Assistant Examiner*—Darwin Hostetter
*Attorney, Agent, or Firm*—Robert E. Burns; Emmanuel J. Lobato; Bruce L. Adams

[57] ABSTRACT

Occurrence of high field domain in the conventional Gunn diode is prevented by covering a solid body such as a semiconductor element partially or wholly by a dielectric member or by a control element such as a metallic layer coupled reactively with the solid body through a dielectric member, whereby a solid state element having a negative differential conductivity is obtained. Such a type of negative-resistance solid state element, together with its various modes of embodimental construction disclosed herein, affords a superior solid state element which is applicable to amplifiers, oscillators, logic memories, and the like of millimeter or submillimeter bands.

4 Claims, 22 Drawing Figures

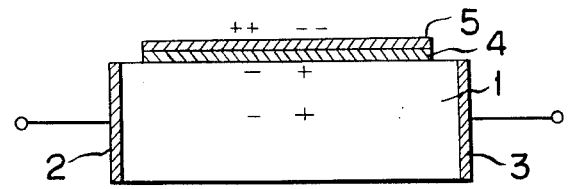
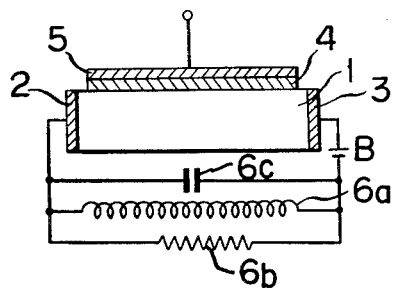
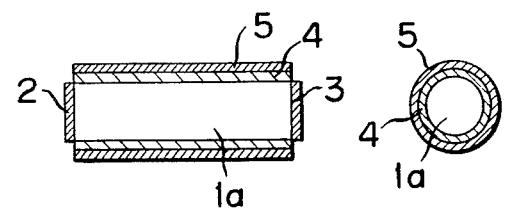
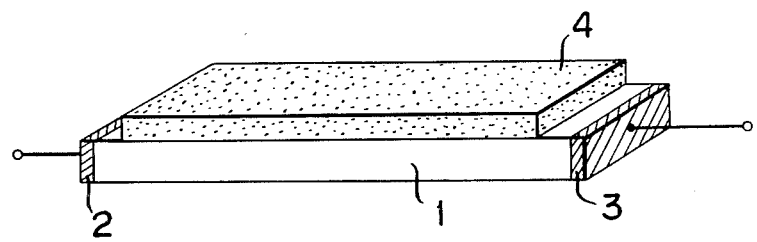
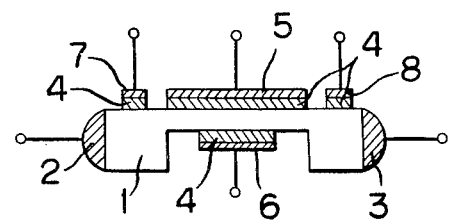

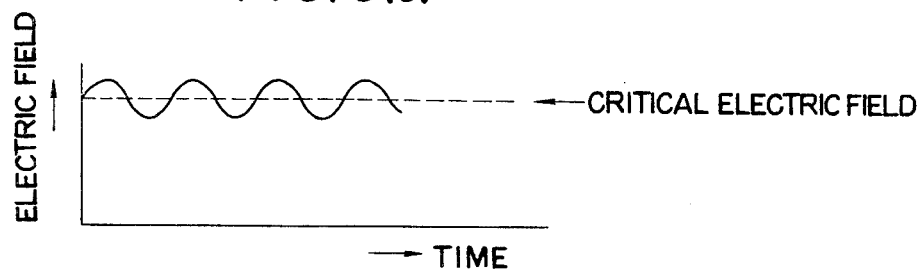
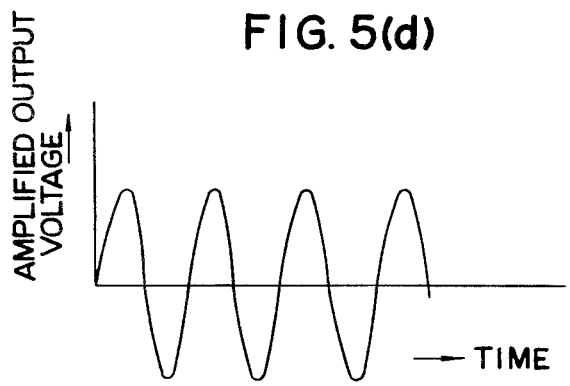
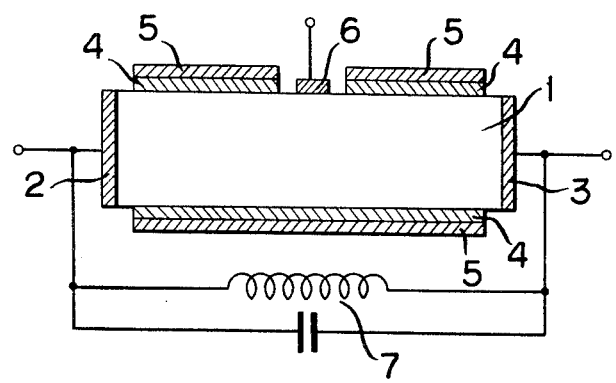

NEGATIVE RESISTANCE ELEMENT CIRCUIT COMBINATIONS

REFERENCE TO RELATED APPLICATIONS

This application is a division of our copending application Ser. No. 167,410 filed July 28, 1971 and now U.S. Pat. No. 3,691,481 which in turn is a continuation-in-part of our application Ser. No. 776,292 filed Aug. 20, 1968 and now abandoned.

BACKGROUND OF THE INVENTION

This invention relates to a novel type of negative-resistance solid state element, and more particularly to such type of element that exhibits negative differential conductivity upon application thereto of a high electric field and to applications thereof.

Heretofore, negative-resistance elements such as the so-called Ezaki diode, which utilize a tunnel effect of semiconductors, have been known. However, in the Ezaki diode, since the negative resistance is obtained at the P-N junction of the semiconductive substances, the negative differential conductivity is exhibited only for a specific polarity, and because of the capacitance existing at the junction point, the element cannot be used at frequencies higher than 10 GHz. These features together with its limited output power constitute the drawbacks of this type of diode.

The so-called Gunn diode is also known, wherein a semiconductive material such as GaAs which has two valleys in its conduction band is employed. When a high electric field is applied across such an element, electrons are transferred from the lower energy valley to the higher energy valley, and because mobility of the electrons in the higher energy valley is less than the mobility in the lower energy valley, the average speed of electrons decreases with increase in electric field. When the intensity of the internal electric field applied from outside as described above exceeds a critical value (about 3000V/cm), a high field domain is created near the cathode, which is thereafter shifted to the anode by the action of the applied electric field. When the high field domain reaches the anode, it disappears at once, and an impulsive current is caused to flow through the semiconductive substance because of the disappearance of the high field domain. Following this disappearance, new high field domain is created near the cathode and the same sequences mentioned above are repeated at a frequency determined by the length of the element.

This type of solid state element can be utilized in generating high-frequency oscillation of a frequency determined by $l/v_d$, wherein $l$ designates the length of the element, and $v_d$ designates the velocity of the high field domain. Considering the fact that the velocity $v_d$ of the high field domain is about $10^7$ cm/sec., it is apparent from this formula that the length of the element must be minimized to an extremely short value (of the order of several microns) if it is desired to obtain microwave or millimeter wavelength.

Despite various efforts to obtain still higher frequencies than those described above, it has been found that the practical limitation exists around several tens of GHz, and the resultant oscillation output is rapidly decreased with increase in the frequency. Such features together with its excessively narrow frequency band constitute drawbacks of the Gunn type solid element.

The so-called LSA diode is also known. It is believed that with this type of diode further increase in the oscillation frequency can be attained with a moderate efficiency. However, in this case, since the biasing electric field must be higher than twice the value of the Gunn diode, the semiconductive material must be of extremely uniform quality, and, moreover, as there is a limitation in the relationship between the electron density and frequency, these are other features constituting the shortcomings of the LSA diode.

We have found that, if one or whole part of the surface of a semiconductive element of, for instance, GaAs, is covered by a dielectric layer or a metallic layer which is reactively coupled with the semiconductive element through an intermediate dielectric thin layer, the occurrence of the high field domain at the time when a high electric field is applied thereacross can be prevented, and a novel condition which might be called "negative-differential resistance characteristic" or "negative differential conductivity" can be obtained.

SUMMARY OF THE INVENTION

With the above-described discovery in view, the principal object of the present invention is to provide a novel type negative-resistance solid state element, whereby the afore-described difficulties in conventional elements are substantially reduced or eliminated.

Another object of the present invention is to provide a novel type of solid state element, which is operable under an entirely new principle completely differing from those of the conventional elements, whereby oscillation in a range of from extremely low frequency to 300 GHz can be obtained.

Still another object of the present invention is to provide a novel type of solid state element, which is operable under an entirely new principle and having a completely new configuration, whereby a much improved negative differential conductivity is obtained, and the element is made applicable to a wide variety of applications such as in oscillation, amplification, and logic memory.

The above stated objects and other objects of the present invention can be accomplished by a novel type of negative-resistance solid state element which comprises: a semiconductive element showing negative-differential conductivity in a high electric field and having at least two end portions; a plurality of electrodes ohmically attached to the semiconductive element at least two end portions for application of an electric voltage causing production of said high electric field; and a dielectric member or this dielectric member and at least one control element which cover at least one part of said semiconductor element, said control element being reactively coupled with said semiconductor element through said dielectric member, whereby the high field domain created in the semiconductive element is suppressed at the time when a high electric voltage is applied across the electrodes and a negative-differential conductivity is created within the bulk of the semiconductive element.

The nature, principle, and advantages of the present invention will become more apparent from the following description and appended claims, when considered in conjunction with the accompanying drawings, wherein the same reference numerals refer to like or corresponding parts throughout the several views.

BRIEF DESCRIPTION OF THE DRAWINGS

FIGS. 2(a) and 2(b) are explanatory diagrams for showing the principle of this invention;

FIGS. 3(a) through 3(c) illustrate some typical embodiments of the negative-resistance solid state element according to the present invention;

FIGS. 5(a) through 5(d) are explanatory diagrams showing the principle of operation of the negative-resistance solid state element having a third electrode which can be employed as an input terminal;

FIGS. 6(a) through 6(c) are explanatory diagrams to be used for showing the operation of the negative-resistance solid state element having the third electrode and;

DETAILED DESCRIPTION

Figure 1A:
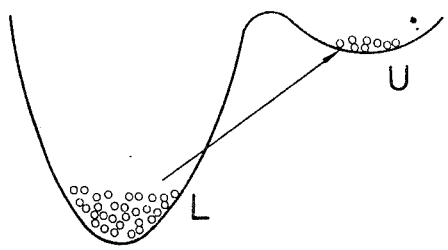
FIGS. 1(a) through 1(e) are explanatory diagrams to be used for an explanation of the conventional Gunn diode.
Figure 1B:
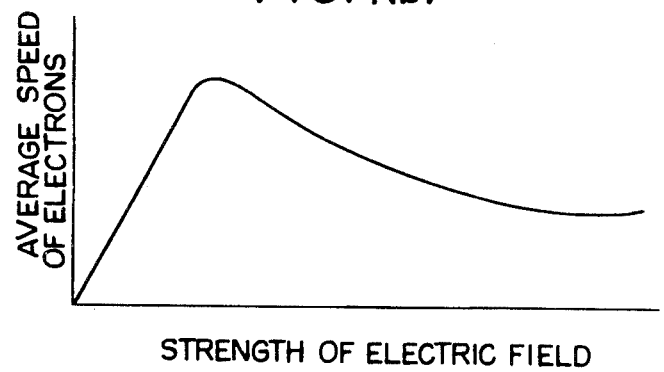
Figure 1C:
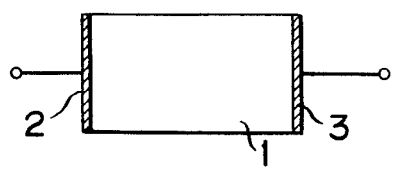

Referring first to FIGS. 1(a) through 1(e) showing explanatory diagrams to be employed for an explanation of the conventional Gunn diode, there is illustrated a semiconductor element such as GaAs which has two valleys in its electron conduction band (see FIG. 1(a)), and because one valley of lower energy has much higher electron mobility than that of the higher energy valley, if such a semiconductor element 1 (see FIG. 1(b)) is provided with two electrodes 2, 3 ohmically connected at both ends, and d.c. high voltage is applied across these electrodes 2, 3, the average speed of the electrons which were at first in the lower energy valley will gradually increase as shown in FIG. 1(b). However, if the applied voltage exceeds a certain critical value, the electrons will start to be transferred to the higher energy valley, and since the mobility of the electrons therein is much lower than that of the first valley, the average speed of the electrons will decrease as shown in the same drawing.

Figure 1E:
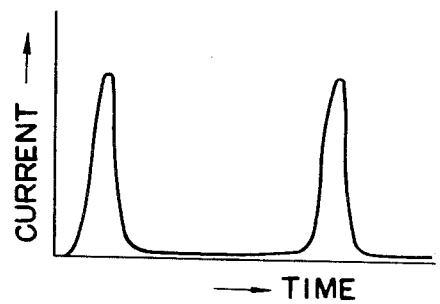
Figure 1D:
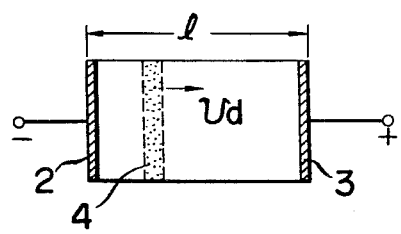

This decrease of the average speed of the electrons should cause negative-differential conductivity within the bulk of the semiconductor element but for the creation of a high field domain as described before. The high field domain is in itself a dipole layer of space charges or a region whereacross a high electric field appears. This high field domain is created at first at a position near the cathode 2 when the internal electric field of the semiconductor element 1 exceeds a critical value of approximately 3000v/cm (in GaAs), and the domain is shifted toward anode 3 at a velocity of $v_d$. The creation of the high field domain causes a decrease in the electric field in other part of the semiconductor element than at the high field domain provided that a constant voltage is applied to the semiconductor element and the current flowing through the semiconductor element 1 is decreased as shown in FIG. 1(e).

When the high field domain reaches the anode 3, it disappears at once. The disappearance of the high field domain causes the resistance of the semiconductor element 1 to decrease, and the current flowing therethrough is increased as indicated by the pulselike peaks in FIG. 1 (e). This type of current oscillation is called "Gunn oscillation" and has been used widely in conjunction with a tuning circuit. The Gunn diode, however, does not show a negative resistance characteristic except at a particular frequency determines by the electron transit time.

Referring now to FIG. 2(a) which illustrates the principle of this invention, a solid state element comprises a semiconductor element 1, electrodes attached to both ends of the semiconductor element, a dielectric member 4, and a metallic layer 5 (control element) which is reactively coupled with the semiconductor element 1 through an intermediately interposed thin layer of the dielectric member 4. In this arrangement, when a d.c. high voltage is applied across the electrodes 2 and 3, and if the value exceeds a certain critical value, the formation of high field domains due to the space charges will now be prevented by the existence of both the dielectric member 4 and the metallic layer 5 which act as capacitors, and the negative differential conductivity will be exhibited in the bulk of the semiconductor element 1. Since this feature of the present invention of negative differential conductivity is obtained not in the local junction layer as in the conventional diodes but within the whole or part of the bulk of the semiconductor element 1, a far larger value of the output can be obtained with much improved efficiency, and this possibility opens up various fields of applications in the high-power ultra-high-frequency technique.

FIG. 2(b) illustrates an example of such applications wherein a tuning circuit is connected across the electrodes 2 and 3, and when the d.c. high voltage applied between the same electrodes exceeds a critical value, an ultra-high frequency oscillation is created, the oscillation output being obtained also between the same electrodes 2 and 3.

In another embodiment of this kind, the high d.c. voltage applied across the electrodes 2 and 3 is kept at a value a little lower than the voltage at which the oscillation is created, and a signal voltage is applied at the metallic layer 5 which in this case acts as a control element. The inside electric field is thus affected by the signal voltage applied at the control element, and an alternating negative resistance of the amplitude and frequency corresponding to the input signal is obtained. This characteristic together with the aforementioned nature of this type of solid element susceptible to wide range of frequency bands affords a superior amplifier applicable to millimeter and submillimeter ranges.

Likewise, the above described solid state element applied with the high-d.c. voltage maintained at a condition at which it is just about to start oscillation is further applied by an impulsive voltage at the control element, i.e., the metallic layer 5, whereby the solid state element can be brought into the oscillating state. On the contrary, when the negative pulse signal is applied to the solid state element, it is brought into a non-oscillating state. Thus, a logic memory element is obtained which can perform logic operations in dependence upon the signal applied to the control element.

The above described provision of metallic layer 5 can be carried out in any of various ways such as providing it only on one side or on both sides of a planar semiconductor element 1, or around the peripheral surface of a cylindrical semiconductor element 1a as shown in FIG. 3(a), or the layer 5 can be provided along substantially the whole longitudinal length or along one part of the longitudinal length.

Otherwise, the negative-resistance diode is further provided with a pair of output terminals 7 and 8 as shown in FIG. 3(c) so that they are attached reactively at the portions near the electrodes 2 and 3, respectively, whereby the output from the diode may be taken out of the terminals 7 and 8.

For the purpose of enabling skilled persons in the art to understand and readily reduce this principle in practice, the following actual example is shown.

A planar GaAs semiconductor element was prepared from material of doping density $n_o = 6 \times 10^{13}$ cm$^{-3}$ and mobility of 8,000 cm$^2$/Vs in a dimension of 1 mm long, 250$\mu$m thick, and 500$\mu$m wide. At both ends of the element, Au-Ge metal electrodes were ohmically attached by evaporative deposition. When a d.c. voltage of 320 v was applied to the element across the electrode, the current flowing through the element exhibited frequency of about 100 MHz due to travelling domain-mode current oscillation. When a metal plate is attached to this GaAs element through a sheet of "Mylar" as the dielectric material having thickness of 4$\mu$m and relative permittivity of 2.2, no travelling domain-mode current oscillation appeared. Furthermore, result of measurement of the field distribution in the interior of the element by means of capacitance probing revealed that no high field domain existed, and that a d.c. field distributed more at the anode side.

Figure 4A:
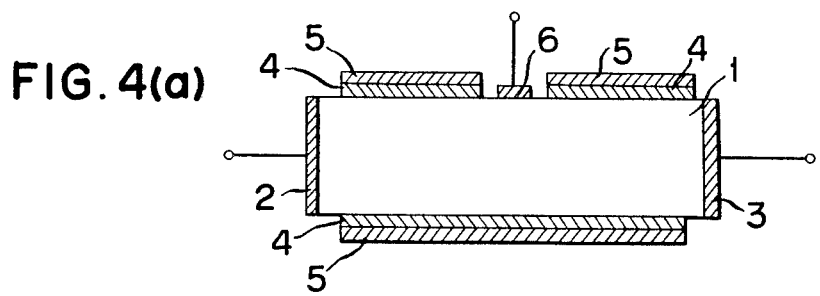
FIGS. 4(a) and 4(b) illustrate other embodiments each having a third electrode which can be used as an input terminal of this kind of negative-resistance solid state element according to this invention.
Figure 4B:
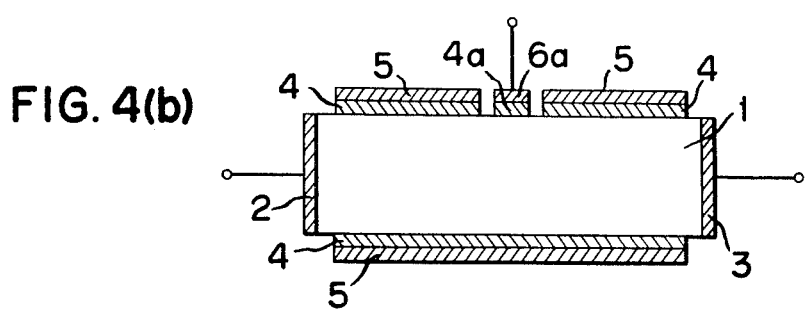

Furthermore, the principle according to the present invention can be applied in the realization of another novel type element wherein a third electrode operable as a control electrode is provided. The construction of such a type of solid state element is shown in FIGS. 4(a) and 4(b). In the drawing, the semiconductor element 1 having ohmically connected electrodes 2, 3 at its opposite ends and a metallic layer 5 reactively coupled to the semiconductor element 1 through a dielectric layer 4, and showing negative differential conductivity in its operation, is further provided with an ohmically attached third electrode 6 (see FIG. 4(a)) or a reactively coupled third electrode 6a (see FIG. 4(b)) through a dielectric layer 4a which is similar to the dielectric layer 4 for the metallic layer 5.

Figure 5A:
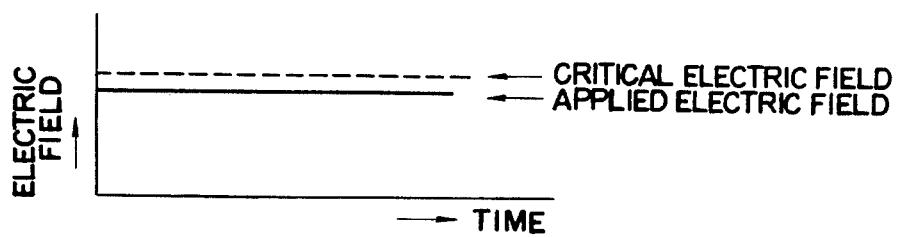
Figure 5B:
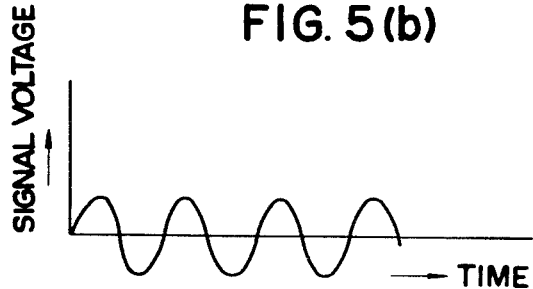

If a high d.c. voltage of a value nearly equal to the critical value (FIG. 5(a)) is applied across the ohmically attached electrodes 2, 3, and a signal voltage (see FIG. 5(b)) is applied on the third electrode 6 or 6a, then the electric field internal of the semiconductor element 1 will vary in accordance with the combined two voltages (FIG. 5(c)), and the electric signal will thereby be amplified as indicated by FIG. 5(d)), the amplified signal appearing across the electrodes 2, 3.

Figure 6B:
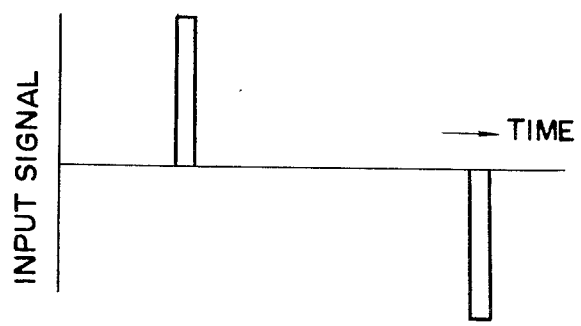
Figure 6C:
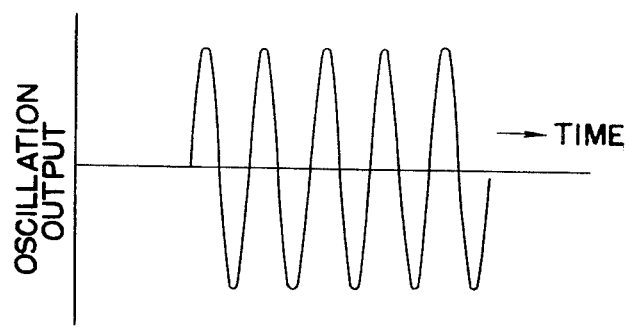

The above described feature indicates that the negative-resistance solid state element having the third electrode 6 or 6a is capable of operating as a vacuum tube or a transistor. When an external tuning circuit 7 is connected across the ohmically attached electrodes 2, 3, as shown in FIG. 6(a), and a high d.c. voltage is applied simultaneously across the same electrodes in such a manner that the oscillation is just about to start, if pulse signal (FIG. 6(b)) is applied at the third electrode 6, this pulse signal will act as a trigger pulse for this oscillator circuit, and an oscillation will start in the same circuit. Likewise, the already started oscillation can be stopped by the application of another pulse voltage having the opposite polarity relative to that of the high d.c. voltage applied across the electrodes 2, 3 (FIG. 6(c)) whereby logic operations can be performed.

Thus, it is apparent that the negative-resistance solid state element having a third electrode which constitutes another novel embodiment of the present invention can operate similarly as a vacuum tube or transistor, and the signal voltage applied at the third electrode can be amplified or the oscillation therein can be started and stopped by the application of an impulsive voltage at the third electrode. Moreover, as was explained hereinbefore, the negativeresistance solid state element is operable at an extraordinarily shorter wave range at high power and high efficiency. Therefore, this type of solid state element can be applied to a wide variety of electronic equipment and more specifically to communication equipment of millimeter and sub-millimeter wavelengths or in high-speed electronic computers.

Alternatively, the metallic layer 5 may be omitted totally and a layer of dielectric material of high dielectric constant, for instance, BaTiO$_3$, may be employed at one side or both sides of the semiconductor element 1 as indicated in FIG. 3(b), whereby the negative-resistance characteristic as described above may also be obtained.

Figure 7A:
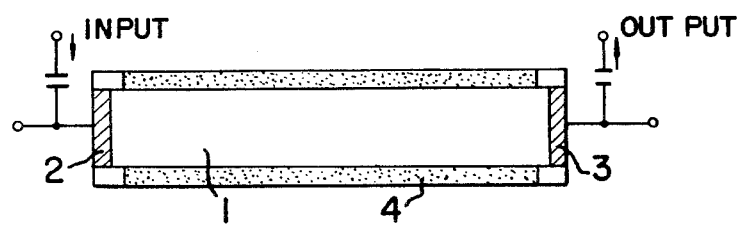
FIGS. 7(a), 7(b) and 7(c) show different modifications of the embodiment, in which input and output electrodes are provided.
Figure 7B:
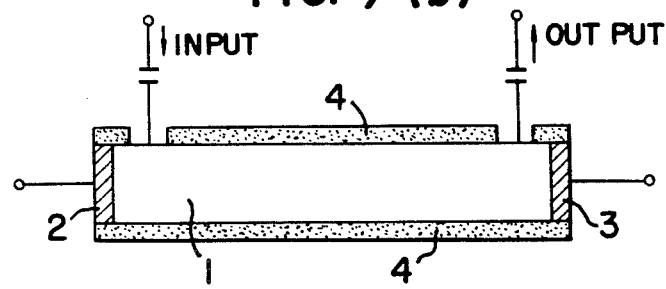
Figure 7C:
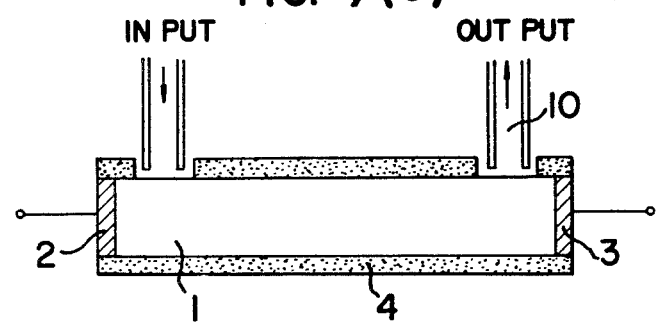

The solid state element of the invention can be effectively utilized as an amplifier element by applying an input signal to an input electrode connected to the cathode or to the semiconductor element 1 at its portion near said cathode as shown in FIGS. 7(a) and 7(b). According to these embodiments, when an input signal is applied to the input electrode, the input signal is amplified during its propagation through the semiconductor element 1 so that an amplified output signal can be led out from the output electrode connected to the anode or to the semiconductor element 1 at its portion near said anode. In this case, the input and/or output signal may be coupled to the semiconductor element 1 in not only capacitive, but also ohmic or inductive manner. The type of coupling may be varied depending on the configuration and dimension of the element and associated parts. As shown in FIG. 7(c), for example, a waveguide 10 may be used as a lead for the input signal or output signal.

What we claim is:

1. In combination: a negative resistance solid state element comprising a solid body composed of semiconductor material having at least two ends and exhibiting a negative resistance characteristic when placed in a high electric field; an electrode ohmicly attached to each of said ends; means for applying an electric voltage across said electrodes to produce a high electric field across said solid body; a dielectric member covering at least one part of said solid body; a control element reactively coupled to said solid body through said dielectric member at a portion intermediate said electrodes effective to control high field domains created in said solid body during application of said high electric field across said solid body to suppress said high field domains and establish in said solid body a negative differential resistance; and a tuning circuit connected in parallel across said electrodes; whereby high frequency oscillations having a frequency determined by the circuit constants of said tuning circuit may be obtained.

2. In combination: a negative resistance solid state element comprising a solid body composed of semiconductor material having at least two ends and exhibiting a negative resistance characteristic when placed in a high electric field; an electrode ohmically attached to each of said ends; means for applying an electric voltage across said electrodes to produce a high electric field across said solid body; a dielectric member covering at least one part of said solid body; a control element reactively coupled to said solid body through said dielectric member at a portion intermediate said electrodes effective to control high field domains created in said solid body during application of said high electric field across said solid body to suppress said high field domains and establish in said solid body a negative differential resistance; and at least one signal input electrode on the surface of said solid body electrically coupled with said solid body; whereby logic operations may be performed in dependence upon the signal applied to said input electrodes.

3. A system for performing logic operations comprising: a negative resistance solid state element having a solid body composed of semiconductor material and having at least two ends and exhibiting a negative resistance characteristic when placed in a high electric field; an electrode ohmicly attached to each of said ends; means for applying an electric voltage across said electrodes to produce a high electric field across said solid body having a magnitude almost equal to the critical voltage at which electric oscillations occur in said solid state element; a dielectric member covering at least one part of said solid body; a control element reactively coupled to said solid body through said dielectric member at a portion intermediate said electrodes effective to control high field domains created in said solid body during application of said electric voltage across said solid body to suppress said high field domains and establish in said solid body a negative differential resistance; and means for applying a pulse signal to said control element to promote or prevent electric oscillations in said solid state element; whereby logic operations may be performed in dependence upon the signal applied to said control element.

4. A negative resistance solid state element for amplifying a high frequency signal comprising: a solid body composed of semiconductor material having at least two ends and exhibiting a negative resistance characteristic when placed in a high electric field; an electrode ohmicly attached to each of said ends; means for applying an electric voltage across said electrodes to produce a high electric field across said solid body having a magnitude somewhat lower than the critical voltage at which electric oscillations occur in said solid body; a dielectric member covering at least one part of said solid body; a control element reactively coupled to said solid body through said dielectric member at a portion intermediate said electrodes to control high field domains created in said solid body during application of said electric voltage across said solid body to suppress said high field domains and establish in said solid body a negative differential resistance; means for applying an alternating signal voltage to said control element; and a tuning circuit connected across said electrodes having a tuning frequency which is tuned at the frequency of said alternating voltage.

* * * * *